(12) United States Patent
Miyase et al.

(10) Patent No.: US 8,453,023 B2
(45) Date of Patent: May 28, 2013

(54) TARGET LOGIC VALUE DETERMINATION METHOD FOR UNSPECIFIED BIT IN TEST VECTOR FOR COMBINATIONAL CIRCUIT AND NON-TRANSITORY COMPUTER-READABLE MEDIUM

(75) Inventors: Kohei Miyase, Fukuoka (JP); Xiaoqing Wen, Fukuoka (JP); Seiji Kajihara, Fukuoka (JP)

(73) Assignee: LPTEX Corporation, Tokyo (JP)

( * ) Notice: Subject to any disclaimer, the term of this patent is extended or adjusted under 35 U.S.C. 154(b) by 445 days.

(21) Appl. No.: 12/761,654

(22) Filed: Apr. 16, 2010

(65) Prior Publication Data

US 2010/0205491 A1 Aug. 12, 2010

Related U.S. Application Data

(63) Continuation-in-part of application No. PCT/JP2008/068778, filed on Oct. 16, 2008.

(30) Foreign Application Priority Data

Oct. 19, 2007 (JP) ................................. 2007-272502

(51) Int. Cl.
*G01R 31/28* (2006.01)
(52) U.S. Cl.
USPC ........................................................ 714/724
(58) Field of Classification Search
USPC .............................. 714/724, 726, 30, 733, 734
See application file for complete search history.

(56) References Cited

U.S. PATENT DOCUMENTS

| 6,247,154 | B1 * | 6/2001 | Bushnell et al. | .............. 714/733 |
| 7,962,822 | B2 * | 6/2011 | Wen et al. | ...................... 714/738 |
| 7,979,765 | B2 * | 7/2011 | Wen et al. | ...................... 714/738 |
| 2009/0083593 | A1 | 3/2009 | Wen et al. | |

FOREIGN PATENT DOCUMENTS

| JP | 7-159499 A | 6/1995 |
| WO | 2006/106626 A1 | 10/2006 |

OTHER PUBLICATIONS

International Search Report for PCT/JP08/068778 mailed Dec. 16, 2008.
Miron Abramovici, et al., Digital Systems TESTING and Testable DESIGN, Computer Science Press, 1990, pp. 183-184, total of 14 pages.
Remersaro, et al. "Preferred Fill: A Scalable Method to Reduce Capture Power for Scan Based Designs", IEEE International Test Conference, 2006, Paper 32.2, pp. 1-10, 10 pages.

(Continued)

*Primary Examiner* — Phung M Chung
(74) *Attorney, Agent, or Firm* — Rankin, Hill & Clark LLP

(57) ABSTRACT

Logic value determination method and program for identifying unspecified bits and determining logic values shortly. The method enables to control the total number of logic value differences between corresponding input and output lines of combinational circuit. The method includes the first step for determining, when output has a logic value and input has an unspecified value, that the unspecified bit has the logic value of output, the second step for determining, when output has an unspecified value and input has a logic value, the logic value of the unspecified bit by justification, and the third step for calculating, when input and output both have unspecified values, probabilities of output to have 0 and 1, and determining the logic value of the unspecified bit based on the difference between the probabilities. The third step is repeated until the total number reaches a target value.

6 Claims, 5 Drawing Sheets

OTHER PUBLICATIONS

Wen, et al. "Critical-Path-Aware X-Filling for Effective IR-Drop Reduction in At-Speed Scan Testing", Design Automation Conference, 2007, 44th ACM/IEEE, Jun. 4-8, 2007, pp. 527-532, 6 pages.

Wang, et al. "Low Capture Power Test Generation for Launch-off-Capture Transition Test Based on Don't-Care Filling", IEEE International Symposium on Circuits and Systems, 2007, pp. 3683-3686, 4 pages.

Wen, et al. "A Novel Scheme to Reduce Power Supply Noise for High-Quality at-Speed Scan Testing", IEEE International Test Conference, 2007, Paper 25.1, pp. 1-10, 10 pages.

Yang, et al. "State-Sensitive X-Filling Scheme for Scan Capture Power Reduction", IEEE Transactions on Computer-Aided Design of Integrated Circuits and Systems, vol. 27, No. 7, Jul. 2008, pp. 1338-1343, 6 pages.

* cited by examiner

US 8,453,023 B2

TARGET LOGIC VALUE DETERMINATION METHOD FOR UNSPECIFIED BIT IN TEST VECTOR FOR COMBINATIONAL CIRCUIT AND NON-TRANSITORY COMPUTER-READABLE MEDIUM

CROSS-REFERENCE TO RELATED APPLICATIONS

This application is a Continuation-in-Part of International Application No. PCT/JP2008/068778 filed Oct. 16, 2008, the entire contents of which is hereby incorporated by reference.

This application is based upon and claims the benefit of priority from prior Japanese Patent Application No. 2007-272502 filed Oct. 19, 2007, the entire contents of which is hereby incorporated by reference.

TECHNICAL FIELD

The present invention relates to a logic value determination method and a logic value determination program for determining target logic values, when a vector composed of logic bits 0 (zero) or 1 (one) and unspecified bits is applied to the combinational circuit in a scan-designed sequential circuit or to an independent combinational circuit, in accordance with an one to one correspondence relation between input lines and output lines of the combinational circuit, to be assigned to the unspecified bits in the vector so that the total number of logic value differences between the corresponding input and output lines increases or decreases.

BACKGROUND ART

Semiconductor large scale integrated circuits (simply, LSI in the following) are shipped after the phases of design, manufacturing and test. Here, test means the operation of determining whether products are defective or defect free by applying test vectors (hereinafter called simply as 'vectors' in the following) to LSI (concretely, the combinational circuit in a sequential circuit, that is, the circuit composed of logic elements of AND gate, NAND gate, OR gate, NOR gate, and so on) manufactured based on design data and by comparing the response with expected value. The rate of defect free LSI products which pass the test (yield) is the to be the key of semiconductor industry because the quality, reliability and cost of LSI depends on it greatly. And at-speed testing conducts tests of LSI at the operating speed of actual use. When vectors are composed of initialization pattern and of launch pattern which detect faults, as shown in FIG. 3, at-speed testing is conducted as follows. The initialization pattern is applied to a combinational circuit at the rising timing of a shift pulse $S_L$. Subsequently, the launch pattern is applied to the combinational circuit at the rising timing of a pulse $C_1$. And the resulted response of the combinational circuit is observed at the rising timing of a pulse $C_2$. The testing state of the combinational circuit is finished at the rising timing of a shift pulse $S_1$.

High launch-induced switching activity in a combinational circuit caused by applying the launch pattern after the pulse $C_1$ results in frequent decrease of power supply voltage (IR-drop) and increase of power supply noise, increasing the delay in the combinational circuit. If the delay increases too much, the adequate response which should be obtained at the timing of the pulse $C_2$ cannot be obtained, resulting in capturing a wrong response to flip-flops in the sequential circuit by timing error. Consequently, test malfunction where a product is wrongly determined as defective occurs because the response from the combinational circuit doesn't match the expected value. And test malfunctions occur frequently in at-speed testing where the timing gap between capture $C_1$ and capture $C_2$ is narrow.

There is a method for generating a vector which doesn't cause IR-drop, called X-filling technique. When detecting one or a plurality of kinds of faults to be detected in an LSI (concretely, the combinational circuit in a sequential circuit), it is possible to detect the faults by assigning logic values 0 or 1 only to a part of bits which relates to detecting the faults in the vector. X-filling technique is a technique to determine the rest of the bits which don't relate to detecting the faults (that is, which don't decrease fault coverage) in the vector as unspecified bits (X-bits) and to assign logic values 0 or 1 to the X-bits for a particular purpose. For example, when the response $F_p(V)$ and $F_s(V)$ are obtained for a vector V which is composed of $V_p$ and $V_s$, as shown in FIG. 4, the difference can be decreased between $V_s$ and $F_s(V)$. Here, in the FIG. 4, $p_i$ (i=1 to 6) and $q_i$ (i=1 to 6) denotes input lines and output lines of the combinational circuit 11, respectively. In Patent Document 1, X-bit identification from any bit for the whole vector set is described.

Patent Document 1: WO 2006/106626 A1.

DISCLOSURE OF THE INVENTION

Problems to be Solved by the Invention

However, with the method in the Patent Document 1, there is a problem that don't-care-bits effective for avoiding test malfunctions are not obtained frequently, because many of the bits more effective when they are not X-bits are also identified as X-bits. Besides, in assigning logic values to X-bits of pseudo primary output lines, which is output lines from a combinational circuit and input lines to flip-flops, justification is conducted necessarily referring to signal lines and signal values in the combinational circuit. Therefore, there is also a problem that the operation time for assigning logic values to X-bits of pseudo primary output lines increases in proportion to the increase of signal lines in the combinational circuit.

It is, therefore, an object of the present invention to provide a logic value determination method and a logic value determination program which enable to identify unspecified bits in a vector which don't lower detecting capability of testing and determine target logic values to be assigned to the unspecified bits in a short time.

Means for Solving the Problems

For solving the problems, a first aspect in accordance with the present invention provides a logic value determination method for determining a target logic value to be assigned to an unspecified bit in a vector which is composed of specified bits of logic values 0 and 1 and unspecified bits and which is applied to the combinational circuit in a scan-designed sequential circuit or an independent combinational circuit, so that the total number of logic value differences between the corresponding input and output lines of the combinational circuit increases or decreases, in accordance with an one-to-one correspondence relation provided between a part of or all of the input lines and a part of or all of the output lines, comprising:

the first logic value determination step for determining, in the case where an output line has a logic value and corresponding input line has an unspecified value, the logic value of the output line as the target logic value of the input line corresponding to the output line;

the second logic value determination step for determining, in the case where an output line has an unspecified value and corresponding input line has a logic value, the target logic value to be assigned to the unspecified bit in the vector by justification that makes the logic value of the input line appear at the output line; and the third logic value determination step for calculating, in the case where an input line and corresponding output line both have unspecified values, the probability of the output line to have logic value 0 and the probability of the output line to have logic value 1, and determining the target logic value to be assigned to the unspecified bit in the vector corresponding to the input line based on the difference between the probabilities, wherein the third logic value determination step is repeated until the total number of logic value differences reach a target value.

Concerning the logic value determination method in accordance with the present invention, it is preferred that, in the case where the total number of logic value differences needs to be reduced, and where the difference between the probabilities is greater than a predetermined limit value in the third logic value determination step, the target logic value to be assigned to the unspecified bit in the vector corresponding to the input line is determined as the logic value of the output line with the larger probability.

Concerning the logic value determination method in accordance with the present invention, it is preferred that, in the case where the total number of logic value differences needs to be increased, and where the difference between the probabilities is greater than a predetermined limit value in the third logic value determination step, the target logic value to be assigned to the unspecified bit in the vector corresponding to the input line is determined as the logic value of the output line with the smaller probability.

A second aspect in accordance with the present invention provides a logic value determination program for determining a target logic value to be assigned to an unspecified bit in a vector which is composed of specified bits of logic values 0 and 1 and unspecified bits and which is applied to the combinational circuit in a scan-designed sequential circuit or an independent combinational circuit, so that the total number of logic value differences between the corresponding input and output lines of the combinational circuit increases or decreases, in accordance with an one to one correspondence relation provided between a part of or all of the input lines and a part of or all of the output lines, comprising:

the first logic value determination procedure for determining, in the case where an output line has a logic value and corresponding input line has an unspecified value, the logic value of the output line as the target logic value of the input line corresponding to the output line;

the second logic value determination procedure for determining, in the case where an output line has an unspecified value and corresponding input line has a logic value, the target logic value to be assigned to the unspecified bit in the vector by justification that makes the logic value of the input line appear at the output line;

the third logic value determination procedure for calculating, in the case where an input line and corresponding output line both have unspecified values, the probability of the output line to have logic value 0 and the probability of the output line to have logic value 1, and determining the target logic value to be assigned to the unspecified bit in the vector corresponding to the input line based on the difference between the probabilities; and a total number of logic value differences determination procedure for repeating the third logic value determination procedure until the total number of logic value differences reach a target value.

Concerning the logic value determination program in accordance with the present invention, it is preferred that, in the case where the total number of logic value differences needs to be reduced, and where the difference between the probabilities is greater than a predetermined limit value in the third logic value determination procedure, the target logic value to be assigned to the unspecified bit in the vector corresponding to the input line is determined as the logic value of the output line with the larger probability.

Concerning the logic value determination program in accordance with the present invention, it is preferred that, in the case where the total number of logic value differences needs to be increased, and where the difference between the probabilities is greater than a predetermined limit value in the third logic value determination procedure, the target logic value to be assigned to the unspecified bit in the vector corresponding to the input line is determined as the logic value of the output line with the smaller probability.

Effect of the Invention

According to the logic value determination method and the logic value determination program in accordance with the present invention, a target logic value is assigned to an unspecified bit in a vector by justification only in the case where an output line has an unspecified value and corresponding input line has a logic value. Therefore, target logic values to be assigned to unspecified bits can be determined in a short time even for a larger combinational circuit (a circuit with more signal lines) and it is easier to control the total number of logic value differences between the input and output lines. As a result, the target test of an LSI can be conducted in a short time, and test cost can be reduced.

In particular, when the logic values of unspecified bits are determined based on probabilities, the total number of logic value differences between the input and output lines can be controlled with high accuracy.

DESCRIPTION OF REFERENCE SYMBOLS 10 sequential circuit
11 combinational circuit
12 flip-flops

PREFERRED EMBODIMENT OF THE INVENTION

In what follows, referring to the attached figures, a preferred embodiment of the present invention will be explained for better understanding of the present invention.

Figure 1:
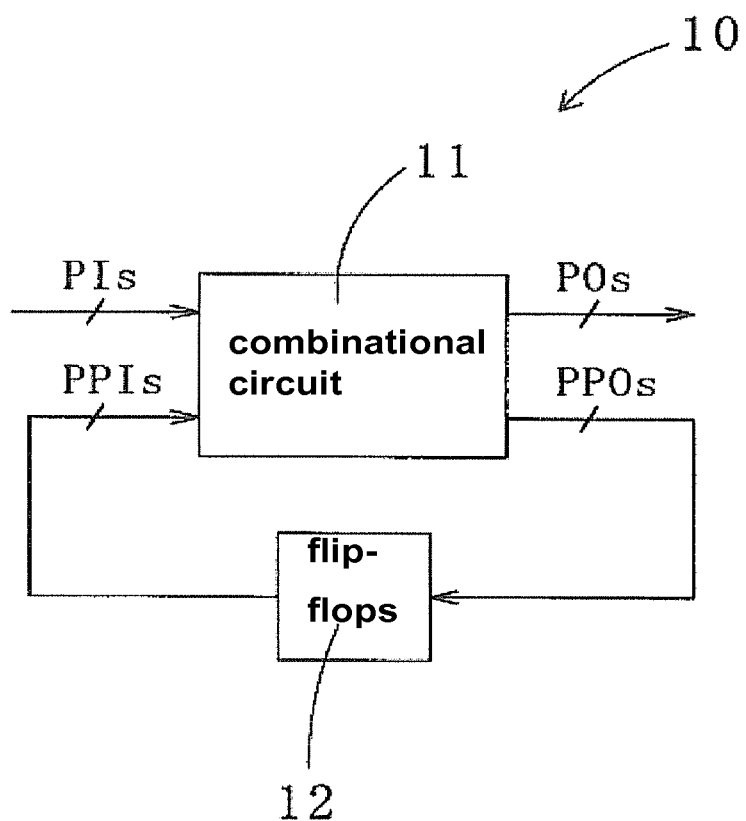
FIG. 1 shows an explanatory diagram of a scan-designed sequential circuit to which the logic determination method according to a preferred embodiment of the present invention is employed.
Figure 2:
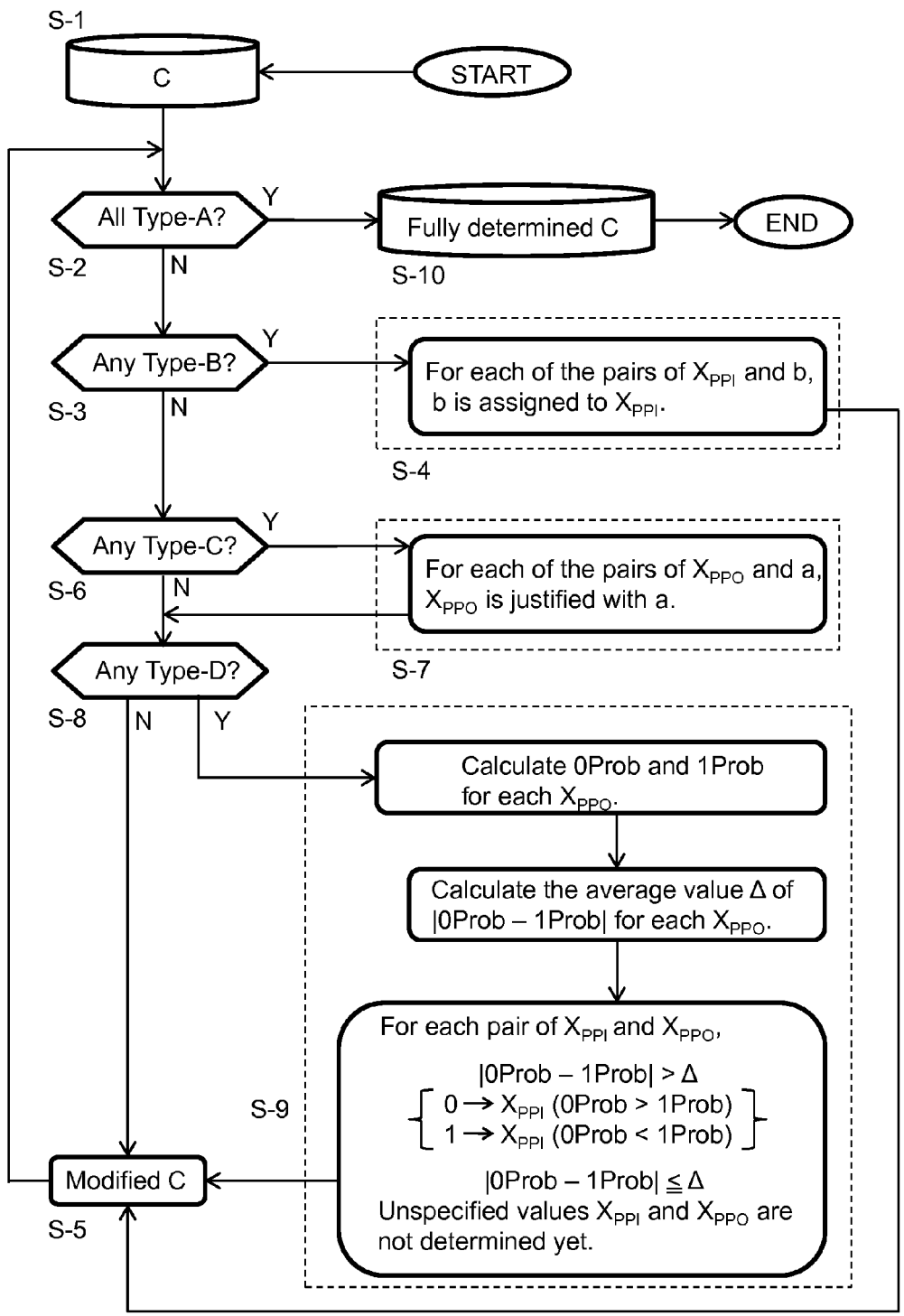
FIG. 2 shows a flowchart showing the logic determination program according to a preferred embodiment of the present invention.
Figure 3:
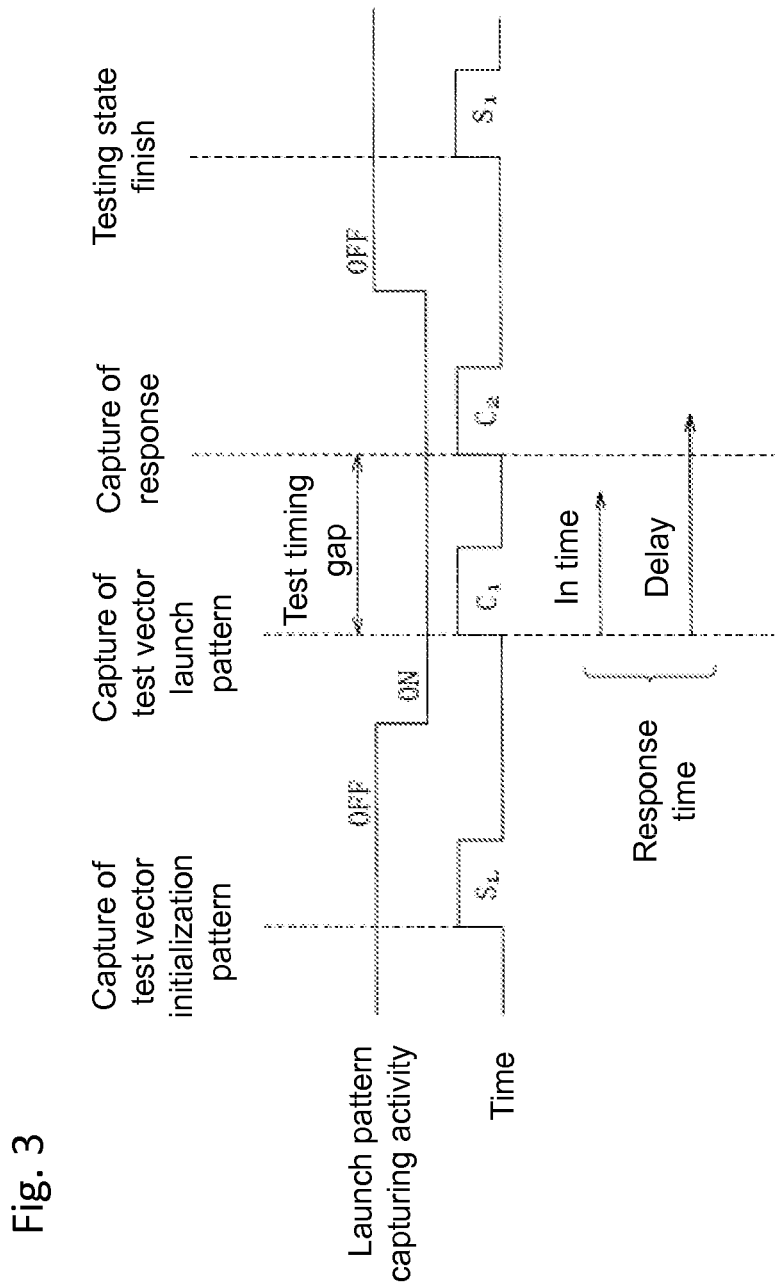
FIG. 3 shows an explanatory diagram of the reason why at-speed test malfunction of LSI occurs.
Figure 4:
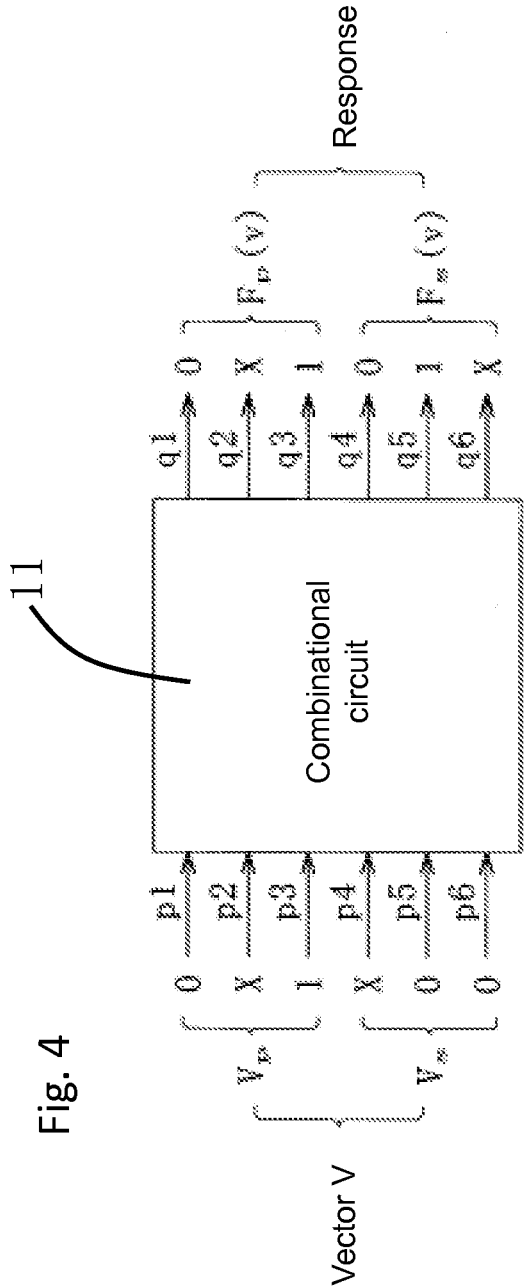
FIG. 4 shows an explanatory diagram of the relationship between a test vector applied to a combinational circuit and response.
Figure 5:
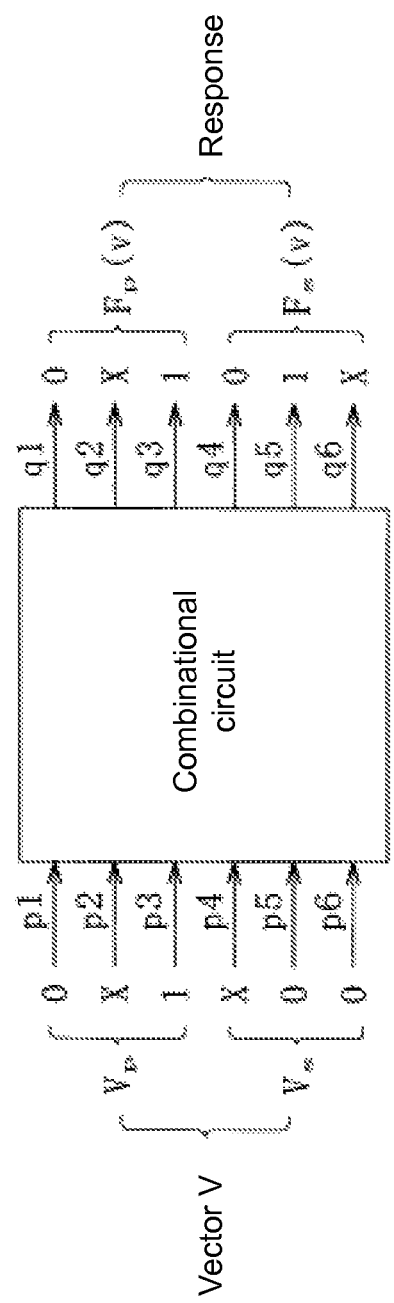

FIG. 1 shows an explanatory diagram of a scan-designed sequential circuit to which the logic value determination method according to a preferred embodiment of the present invention is employed. FIG. 2 shows a flowchart showing the logic value determination program according to a preferred embodiment of the present invention.

As shown in FIG. 1, a scan-designed sequential circuit 10 to which the logic value determination method according to a preferred embodiment of the present invention is employed comprises a combinational circuit 11 composed of logic elements and flip-flops 12 which memorize the internal states of the combinational circuit 11. The input lines of the combinational circuit 11 includes primary input lines PIs which are accessible directly from outside, and pseudo primary input lines PPIs which are output lines of flip-flops 12. The output lines of the combinational circuit 11 includes primary output lines POs which are accessible directly from outside (which can output directly outside), and pseudo primary output lines PPOs which are input lines to flip-flops 12. Here, the numbers of bits are not necessarily the same between primary input lines PIs and primary output lines POs, but the numbers of bits are always the same between pseudo primary input lines PPOs and pseudo primary output lines PPIs.

In order to avoid test malfunction in an at-speed scan testing of the sequential circuit 10, the IR-drop should be small on applying a test vector. To accomplish the purpose, target logic values are determined to be assigned to unspecified bits for decreasing the total number of logic value differences between the corresponding pseudo primary input lines PPIs and the pseudo primary output lines PPOs, in accordance with the one to one correspondence relation between all the pseudo primary input lines PPIs and all the primary output lines PPOs, which is provided when a test vector composed of logic bits 0 or 1 and unspecified bits is applied to the pseudo primary input lines PPIs of the combinational circuit 11 in the sequential circuit 10.

The logic value determination method for assigning target logic values to unspecified bits, in order to decrease the total number of logic value differences, comprises the first logic value determination step, the second logic value determination step and the third logic value determination step, and repeats the third logic value determination step until the total number of logic value differences reach a target value. Here, the first logic value determination step is a step for determining, in the case where pseudo primary output lines PPOs as an example of output lines have logic values and corresponding pseudo primary input lines PPIs as an example of input lines have unspecified values, the logic value of the pseudo primary output lines PPOs as the target logic values of the unspecified bits in the vector corresponding to the pseudo primary input lines PPIs. The second logic value determination step is a step for determining, in the case where the pseudo primary output lines PPOs have unspecified values and corresponding pseudo primary input lines PPIs have logic values, the target logic values of the unspecified bits in the vector by justification that makes the logic value of the pseudo primary input lines PPIs appear at the pseudo primary output lines PPOs. The third logic value determination step is a step for calculating, in the case where the pseudo primary input lines PPIs and corresponding pseudo primary output lines PPOs both have unspecified values, the probabilities of the pseudo primary output lines PPOs to have logic values 0 and the probabilities of the pseudo primary output lines PPOs to have logic values 1, and determining the target logic values of the unspecified bits in the vector corresponding to the pseudo primary input lines PPIs, in the case where the difference between the probabilities is greater than a predetermined limit value, as logic values of the pseudo primary output lines PPOs with the larger probability.

A target logic values is assigned to an unspecified bit in a vector by justification only in the case where pseudo primary output lines PPOs have unspecified values and corresponding pseudo primary input lines PPIs have logic values. Therefore, target logic values to be assigned to unspecified bits can be determined in a short time even for a larger combinational circuit 11 (a circuit with more signal lines) and it is easier to reduce the total number of logic value differences between pseudo primary input lines PPIs and pseudo primary output lines PPOs. Besides, because the logic values of unspecified bits are determined based on probabilities, the total number of logic value differences between pseudo primary input lines PPIs and pseudo primary output lines PPOs can be reduced with high accuracy.

The following is the description of the logic determination program according to a preferred embodiment of the present invention, for determining target logic values to be assigned to unspecified bits in a test vector when at-speed scan test malfunctions in sequential circuit 10 are to be avoided.

The logic value determination program determine target logic values to be assigned to unspecified bits so that the total number of logic value differences between pseudo primary input lines PPIs and pseudo primary output lines PPOs decreases. The logic determination program comprises the first logic value determination procedure and the second logic value determination procedure. As shown in Table 1, in the first logic value determination procedure, for a pair in which the pseudo primary output lines PPOs have logic value b and corresponding pseudo primary input lines PPIs have unspecified value $X_{PPI}$ (Type-B), the logic value of the primary output lines PPOs, b is determined as the target logic value of the unspecified bit in the vector corresponding to the pseudo primary input lines PPIs. In the second logic value determination procedure, for a pair in which the pseudo primary output lines PPOs have unspecified value $X_{PPO}$ and corresponding pseudo primary input lines PPIs have logic value a (Type-C), the target logic value of the unspecified bit in the vector is determined by justification that makes the logic value of the pseudo primary input lines PPIs a appear at the pseudo primary output lines PPOs.

TABLE 1

| | PPI | PPO | X-filling action |
|---|---|---|---|
| Type-A | Specified logic value, a | Specified logic value, b | No action |
| Type-B | Unspecified logic value, $X_{PPI}$ | Specified logic value, b | Assignment of b |
| Type-C | Specified logic value, a | Unspecified logic value, $X_{PPO}$ | Justification |
| Type-D | Unspecified logic value, $X_{PPI}$ | Unspecified logic value, $X_{PPO}$ | Assignment based on calculated probabilities |

The logic value determination program further comprises the third logic value determination procedure and the total number of logic value differences determination procedure. In the third logic value determination procedure, for a pair in which the pseudo primary input lines PPIs and corresponding pseudo primary output lines PPOs both have unspecified values $X_{PPI}$ and $X_{PPO}$ (type-D), probabilities of the pseudo primary output lines PPOs to have logic value 0 (0Prob) and probabilities of the pseudo primary output lines PPOs to have logic value 1 (1Prob) are calculated. Then, in the case where the difference between the probabilities is greater than a predetermined limit value, the logic value with the larger probability is assigned to the unspecified value of the pseudo primary output lines PPOs, $X_{PPO}$, and the same logic values with those assigned to the unspecified value $X_{PPO}$ are assigned to the pseudo primary input lines PPIs. In the total number of logic value differences determination procedure, the third logic value determination procedure is repeated until all the pairs of logic values of the pseudo primary input lines PPIs and the logic values of the pseudo primary output lines PPOs, which are in an one to one correspondence relation, become pairs of Type-A, where both of the logic values have specified logic values. (That is, until the total number of logic value differences reach a target value.)

Here, it is possible that the difference between the probability of an unspecified bit $X_{PPO}$ to have 0 and the probability of an unspecified bit $X_{PPO}$ to have 1 is negligibly small. In this case, the absolute value of the probability difference between 0Prob and 1Prob (|0Prob−1Prob|) of unspecified value $X_{PPO}$ is determined for each pair, and only in the case where |0Prob−1Prob| is greater than a predetermined limit value, the logic value with the larger probability is assigned to each of the unspecified values of the pseudo primary input lines PPIs and the pseudo primary output lines PPOs, $X_{PPI}$ and $X_{PPO}$, respectively. Here, the limit value can be the average value Δ of |0Prob−1Prob| determined for each pair. Then, in the case where |0Prob−1Prob|>Δ, 0 is assigned to unspecified values $X_{PPI}$ and $X_{PPO}$ if 0Prob>1Prob and 1 is assigned to unspecified values $X_{PPI}$ and $X_{PPO}$ if 0Prob<1Prob.

Next, the logic value determination program is explained in detail, referring to FIG. 2.

First, in S-1, by use of, for example, a conventional ATPG program (automatic test pattern generation program), a vector composed of logic bits 0 or 1 and unspecified bits (test cube) C is determined as a test vector to be applied to pseudo primary input lines PPIs. Next, in S-2, Type-A determination is conducted, where it is determined whether all the pairs of the logic bits of the pseudo primary input lines PPIs and corresponding pseudo primary output lines PPOs are the pairs of logic values a and b. Because the logic values of the pseudo primary input lines PPIs and the logic values of the pseudo primary output lines PPOs includes unspecified bits $X_{PPI}$ and $X_{PPO}$, they are not determined as Type-A.

Subsequently, in S-3, Type-B determination is conducted, where it is determined whether such pairs that the pseudo primary input lines PPIs have unspecified values $X_{PPI}$, and corresponding pseudo primary output lines PPOs have logic values b exist or not in all the pairs. As for the pair determined as Type-B, in S-4, a specified logic value b is assigned to the unspecified value $X_{PPI}$, and the resulted vector is, in S-5, saved as a modified vector (modified C). (The procedure, described here, is the first logic value determination procedure.)

As for the pair determined as not Type-B, in S-6, Type-C determination is conducted, where it is determined whether such pairs that the pseudo primary input lines PPIs have logic values, a, and corresponding pseudo primary output lines PPOs have unspecified values $X_{PPO}$ exist or not. As for the pair determined as Type-C, in S-7, the logic value to be assigned to $X_{PPO}$ is determined by justification based on signal path and logic value a. (The procedure, described here, is the second logic value determination procedure.)

Subsequently, as for the pair determined as not Type-C, in S-8, Type-D determination is conducted, where it is determined whether such pairs that the pseudo primary input lines PPIs and the pseudo primary output lines PPOs both have unspecified values $X_{PPI}$ and $X_{PPO}$, respectively, exist or not. As for the pair determined as Type-D, in S-9, the probabilities of the pseudo primary output lines PPOs to have logic value 0 (0Prob) and the probabilities of the pseudo primary output lines PPOs to have logic value 1 (1Prob) are calculated for each pair. Here, the pair whose unspecified value $X_{PPO}$ is determined by justification is taken into consideration. Then, |0Prob−1Prob| is determined for each pair, and the average value Δ of |0Prob−1Prob| is calculated. In the case where |0Prob−1Prob| is greater than Δ, 0 is assigned to unspecified value Δ $X_{PPI}$ and $X_{PPO}$ if 0Prob>1Prob and 1 is assigned to the unspecified values $X_{PPI}$ and $X_{PPO}$ if 0Prob<1Prob. In the case where |0Prob−1Prob| is equal to or less than Δ, the unspecified values $X_{PPI}$ and $X_{PPO}$ are not determined. The resulted vector is, in S-5, saved as a modified C. The pair determined as not Type-D is, in S-5, also saved in a modified C. (The procedure, described here, is the third logic value determination procedure.)

The modified C obtained above is, in S-2, determined whether all the pairs of the logic values of the pseudo primary input lines PPIs and the pseudo primary output lines PPOs are Type-A, or not. If all the pairs are determined as Type-A, the modified C is, in S-10, saved as a fully-specified vector C. As for the pair determined as not Type-A, the Type-B determination, the Type-C determination or the Type-D determination in S-3, S-6 or S-8, respectively, and the operations of S-4, S-7, S-9, respectively, are conducted. Then, the modified C is generated in S-5. The procedures are repeated until all the pairs are determined as Type-A. (The procedure, described here, is the total number of logic value differences determination procedure.) This leads to the decrease of the total number of logic value differences between the pseudo primary input lines PPIs and the pseudo primary output lines PPOs.

Although the present invention has been described above, referring to the preferred embodiment, the present invention is not restricted to the described configuration at all. The present invention includes other preferred embodiments or variants within the scope of the matters described in the claims.

For example, in S-2, Type-A determination is conducted, where it is determined whether all the pairs of the logic bits of the pseudo primary input lines and the logic bits of the pseudo primary output lines are Type-A or not. Here, with a predetermined number of the pairs determined as Type-A, the number of times of the third logic value determination procedure is limited, enabling to control the rate of decrease of the total number of logic value differences between input lines and output lines. Besides, it is possible to apply the logic value determination method or the logic value determination program in accordance with the present invention to only a part of corresponding pseudo primary input line and pseudo primary output line, in place of all of them. This way also enables to control the rate of decrease of the total number of logic value differences between input and output lines.

In addition, in the first logic value determination procedure, after S-4, the procedure may proceed to S-6 in place of S-5. And in the second logic value determination procedure, after S-7, the procedure may proceed to S-5 in place of S-8. It is possible to control the processing time of the whole flow of the present invention according to, for example, the size of the combinational circuit by modifying the order of the procedure as described above.

In addition, in the third logic value determination procedure, in the case where the difference between the probabilities is greater than a predetermined limit value, the logic value of the output line with the smaller probability can be the target logic value of the unspecified bit in a vector corresponding to the input line, resulting in the increase of the total number of logic value differences. This leads to, for example, improve the detecting capability of defects in a sequential circuit in an at-speed scan testing of the sequential circuit.

And, the LSI to which the logic value determination method or the logic value determination program in accordance with the present invention is applied can be an independent combinational circuit.

INDUSTRIAL APPLICABILITY

In the testing to determine an LSI as defective or defect free, unspecified bits which don't affect the detecting capability of testing are identified and the target logic values to be assigned to the unspecified bits are determined in a short time. As a result, test malfunctions where a defect free product is determined as defective are decreased and the product yield is increased.

The invention claimed is:

1. A logic value determination method for determining a target logic value to be assigned to an unspecified bit in an input vector which is composed of specified bits of logic values 0 and 1 and unspecified bits and which is applied to a combinational circuit in a scan-designed sequential circuit or an independent combinational circuit, so that a total number of logic value differences between corresponding input and output lines of the combinational circuit increases or decreases, in accordance with an one-to-one correspondence relation provided between a part of or all of the input lines and a part of or all of the output lines, comprising:
   a first logic value determination step for determining, in a case where an output line has a logic value and corresponding input line has an unspecified value, the logic value of the output line as the target logic value of the input line corresponding to the output line;
   a second logic value determination step for determining, in a case where an output line has an unspecified value and corresponding input line has a logic value, the target logic value to be assigned to the unspecified bit in the input vector by justification that makes the logic value of the input line appear at the output line; and
   a third logic value determination step for calculating, in a case where an input line and corresponding output line both have unspecified values, probability of the output line to have logic value 0 and probability of the output line to have logic value 1, and determining the target logic value to be assigned to the unspecified bit in the input vector corresponding to the input line based on difference between the probabilities,
   wherein the third logic value determination step is repeated until the total number of logic value differences reaches a threshold value.

2. The logic value determination method according to claim 1,
   wherein, in a case where the total number of logic value differences needs to be reduced, and where the difference between the probabilities is greater than a predetermined limit value in the third logic value determination step, the target logic value to be assigned to the unspecified bit in the input vector corresponding to the input line is determined as the logic value of the output line with the larger probability.

3. The logic value determination method according to claim 1,
   wherein, in a case where the total number of logic value differences needs to be increased, and where the difference between the probabilities is greater than a predetermined limit value in the third logic value determination step, the target logic value to be assigned to the unspecified bit in the input vector corresponding to the input line is determined as the logic value of the output line with the smaller probability.

4. A non-transitory computer-readable medium storing a logic value determination computer program for determining a target logic value to be assigned to an unspecified bit in an input vector which is composed of specified bits of logic values 0 and 1 and unspecified bits and which is applied to a combinational circuit in a scan-designed sequential circuit or an independent combinational circuit, so that a total number of logic value differences between corresponding input and output lines of the combinational circuit increases or decreases, in accordance with an one to one correspondence relation provided between a part of or all of the input lines and a part of or all of the output lines, the computer program causing a computer to execute:
   a first logic value determination procedure for determining, in a case where an output line has a logic value and corresponding input line has an unspecified value, the logic value of the output line as the target logic value of the input line corresponding to the output line;
   a second logic value determination procedure for determining, in a case where an output line has an unspecified value and corresponding input line has a logic value, the target logic value to be assigned to the unspecified bit in the input vector by justification that makes the logic value of the input line appear at the output line;
   a third logic value determination procedure for calculating, in a case where an input line and corresponding output line both have unspecified values, probability of the output line to have logic value 0 and probability of the output line to have logic value 1, and determining the target logic value to be assigned to the unspecified bit in the input vector corresponding to the input line based on difference between the probabilities; and
   a total number of logic value differences determination procedure for repeating the third logic value determination procedure until the total number of logic value differences reaches a threshold value.

5. The non-transitory computer-readable medium storing the logic value determination computer program according to claim 4,
   wherein, in a case where the total number of logic value differences needs to be reduced, and where the difference between the probabilities is greater than a predetermined limit value in the third logic value determination procedure, the target logic value to be assigned to the unspecified bit in the input vector corresponding to the input line is determined as the logic value of the output line with the larger probability.

6. The non-transitory computer-readable medium storing the logic value determination computer program according to claim 4,
   wherein, in a case where the total number of logic value differences needs to be increased, and where the difference between the probabilities is greater than a predetermined limit value in the third logic value determination procedure, the target logic value to be assigned to the unspecified bit in the input vector corresponding to the input line is determined as the logic value of the output line with the smaller probability.

* * * * *